United States Patent
Buchanan et al.

(10) Patent No.: US 6,750,072 B2
(45) Date of Patent: Jun. 15, 2004

(54) METHOD FOR MICRO-FABRICATING A PIXELLESS INFRARED IMAGING DEVICE

(75) Inventors: Margaret Buchanan, Ottawa (CA); Martin Byloos, Denholm (CA); Shen Chiu, Kanata (CA); Emmanuel Dupont, Hull (CA); Mae Gao, Gloucester (CA); Hui Chun Liu, Orleans (CA); Chun-ying Song, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 10/407,466

(22) Filed: Apr. 7, 2003

(65) Prior Publication Data

US 2003/0211648 A1 Nov. 13, 2003

Related U.S. Application Data

(62) Division of application No. 10/014,478, filed on Dec. 14, 2001, now Pat. No. 6,576,490.
(60) Provisional application No. 60/289,521, filed on May 9, 2001, now abandoned.

(51) Int. Cl.$^7$ .............................................. H01L 21/00
(52) U.S. Cl. .............................. 438/24; 438/59; 438/57
(58) Field of Search ........................... 438/57, 59, 60, 438/72, 74, 75, 23, 24

(56) References Cited

U.S. PATENT DOCUMENTS

| | | | | |
|---|---|---|---|---|
| 5,281,542 A | * | 1/1994 | Hui et al. ...................... 438/94 |
| 5,384,267 A | * | 1/1995 | Hutchins et al. .............. 438/59 |
| 5,567,955 A | * | 10/1996 | Liu ............................. 257/21 |
| 6,028,323 A | * | 2/2000 | Liu ............................. 257/21 |
| 6,245,591 B1 | * | 6/2001 | Beratan et al. ............... 438/55 |
| 2002/0081760 A1 | * | 6/2002 | Whatmore .................... 438/25 |
| 2002/0162995 A1 | * | 11/2002 | Petroff et al. ................. 257/21 |

* cited by examiner

Primary Examiner—Jack Chen
Assistant Examiner—William Vesperman
(74) Attorney, Agent, or Firm—Freedman & Associates

(57) ABSTRACT

The present invention relates to a method for micro-fabricating a pixelless thermal imaging device. The imaging device up-converts a sensed 2-dimensional M/FIR image into a 2-dimensional image in the NIR to visible spectrum in dependence thereupon. A plurality of layers forming an integrated QWIP-LED wafer are crystallographically grown on a surface of a first substrate. The layers comprise an etch stop layer, a bottom contact layer, a plurality of layers forming a QWIP and a LED, and a top contact layer. At the top of the QWIP-LED wafer an optical coupler such as a diffraction grating for coupling at least a portion of incident M/FIR light into modes having an electric field component perpendicular to quantum wells of the QWIP is provided. In following processing steps the first substrate and the etch stop layer are removed. Various different thermal imaging devices are manufactured by changing the order of manufacturing steps, omitting some steps or using different materials. Therefore, it is possible using a same manufacturing equipment for producing a large variety of different imaging devices considerably reducing manufacturing costs.

9 Claims, 17 Drawing Sheets

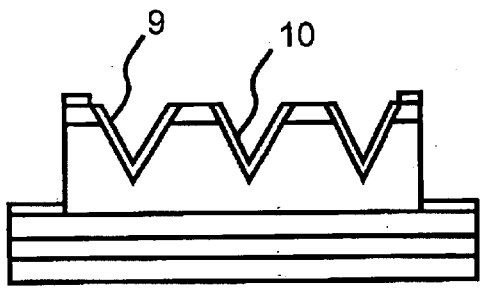
Fig. 3i            Fig. 3j
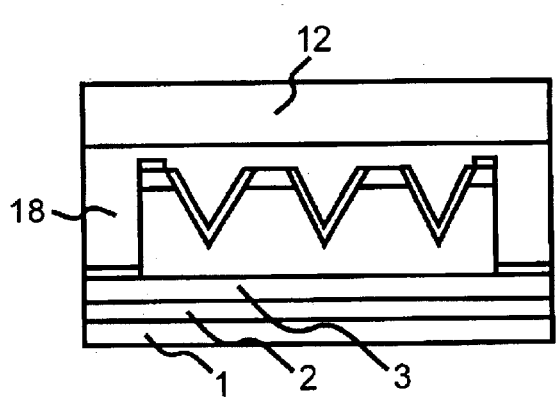
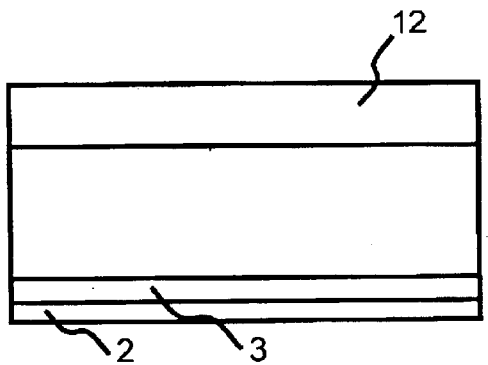
Fig. 3k            Fig. 3l
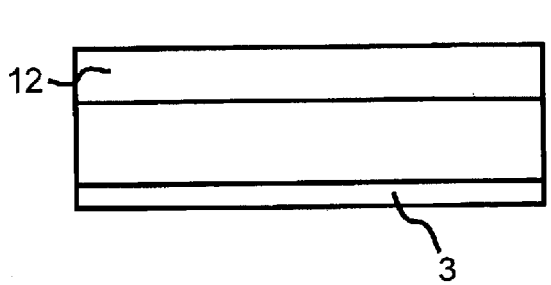
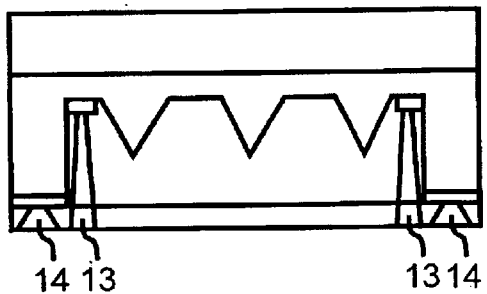
Fig. 3m            Fig. 3n Reflective QWIP-LED:

Transmissive QWIP-LED:

Simplest Implementation

With P-DBR contact

METHOD FOR MICRO-FABRICATING A PIXELLESS INFRARED IMAGING DEVICE

This is a divisional application of U.S. application Ser. No. 10/014,478 filed Dec. 14, 2001 now U.S. Pat. No. 6,576,490, which claims the benefit of United States Provisional Application No. 60/289,521 filed May 9, 2001, now abandoned.

FIELD OF THE INVENTION

This invention relates to infrared thermal imaging devices and in particular to micro-fabrication of pixelless infrared thermal imaging devices comprising epitaxially integrated quantum well infrared photodetector and light emitting diode.

BACKGROUND OF THE INVENTION

Infrared imaging is widely used in a variety of applications including night vision, surveillance, search and rescue, remote sensing, and preventive maintenance, to name a few. Imaging devices to provide these applications are typically constructed of HgCdTe or InSb focal plane arrays. These focal plane arrays are known to be pixel mapped devices, where an array element is generally mapped to one or more circuit elements. However, such focal plane arrays are difficult to manufacture and expensive. Quantum Well Infrared Photodetectors (QWIPs) are able to detect Mid to Far InfraRed (M/FIR) light, providing an output current as a result. However, such devices have not been able to be successfully used in efficient and inexpensive image detectors. The basic idea of QWIPs using intraband or intersubband transition for M/FIR detection have been disclosed in U.S. Pat. No. 4,205,331, issued May 27, 1980 to Esaki et al. and in U.S. Pat. No. 4,873,555, issued Oct. 10, 1989, to Coon et al. Embodiments of QWIPs using intraband or intersubband transitions have been disclosed in U.S. Pat. No. 4,894,526, issued Jan. 16, 1990, to Bethea et al. and U.S. Pat. No. 5,023,685, issued Jun. 11, 1991 to Bethea et al. The latter two patents describe a device having improved efficiency by utilizing a series of quantum wells.

An improvement of these earlier technologies was disclosed by one of the present inventors, H. C. Liu, in U.S. Pat. No. 5,567,955, issued Oct. 22, 1996, to the National Research Council of Canada, incorporated herein by reference, wherein the vertical integration of a Light Emitting Diode (LED) with a QWIP is described. The QWIP-LED is a photon frequency up-conversion device. The device comprises either a photo-diode or a photo-conductor connected in series with a LED. The photo-diode or the photo-conductor acts as a M/FIR detector, whereas the LED emits in the NIR or the visible spectrum. A forward constant bias is applied to the LED with respect to the QWIP. A M/FIR excitation of the detector decreases its resistance and thereby increases the voltage dropped across the LED, leading to an increase in the LED emission intensity. Therefore, the incoming M/FIR radiation has been converted into an increase of the NIR or visible emission. The emission in the NIR is efficiently detected by a Si Charge-Couple Device (CCD), resulting in a highly efficient detector. The vertical integration results from epitaxial deposition of the LED material over the QWIP materials.

Details about the QWIP-LED technology as well as numerous embodiments are disclosed in the following references incorporated herein by reference:

U.S. Pat. No. 5,646,421, issued Jul. 8, 1997, to H. C. Liu;
U.S. Pat. No. 6,028,323, issued Feb. 22, 2000, to H. C. Liu;
H. C. Liu, L. B. Allard, M. Buchanan, Z. R. Wasilewski, "Pixelless infrared imaging device", Electronics Letters 33, 5 (1997);
L. B. Allard, H. C. Liu, M. Buchanan, Z. R. Wasilewski, "Pixelless infrared imaging utilizing a p-type quantum well infrared photodetector integrated with a light emitting diode", Appl. Phys. Lett. 70, 21 (1997);
E. Dupont, H. C. Liu, M. Buchanan, Z. R. Wasilewski, D. St-Germain, P. Chevrette, "Pixelless infrared imaging devices based on the integration of n-type quantum well infrared photodetector with near-infrared light emitting diode", (Photonics West, San Jose, January 1999), SPIE Proc. 3629, 155 (1999);
E. Dupont, H. C. Liu, M. Buchanan, S. Chiu, M. Gao, "Efficient GaAs light-emitting diods by photon recycling", Appl. Phys. Lett. 76, 4 (2000);
E. Dupont, S. Chiu, "Efficient light-emitting diodes by photon recycling and their application in pixelless infrared imaging devices", J. Appl. Phys. 87, 1023, (2000);
S. Chiu, M. Buchanan, E. Dupont, C. Py, H. C. Liu, "Substrate removal for improved performance of QWIP-LED devices grown on GaAs substrates", Infrared Phys. And Techn. 41, 51 (2000); and,
E. Dupont, M. Gao, Z. Wasilewski, H. C. Liu, "Integration of n-type and p-type quantum well infrared photodetectors for sequential multicolor operation", Appl. Phys. Lett. 78, 14 (2001).

A pixelless thermal imaging device is achieved by a suitably fabricated QWIP-LED having a sufficiently large active area for the detection of a 2-dimensional M/FIR image. The up-conversion device is made sufficiently large in area for sensing a 2-dimensional M/FIR image, and an emitted 2-dimensional image in the NIR or visible spectrum is then detected by a standard Si CCD or other standard imaging device. It is possible to manufacture large format 2-dimensional thermal imaging devices having a perfect fill factor without the need for complex readout circuits. The integrated QWIP-LED technology allows manufacture of efficient and inexpensive thermal imaging devices.

It is, therefore, an object of the invention to provide a micro-fabrication method for manufacturing efficient and inexpensive pixelless infrared thermal imaging devices.

It is further an object of the invention to provide a micro-fabrication method for manufacturing pixelless infrared thermal imaging devices based on epitaxial integration of a QWIP with a LED.

It is yet another object of the invention to provide a micro-fabrication method for manufacturing pixelless infrared thermal imaging devices allowing use of a same manufacturing equipment for producing a large variety of different devices.

SUMMARY OF THE INVENTION

The micro-fabrication method according to the invention allows manufacture of numerous different infrared imaging devices based on epitaxial integration of a QWIP with a LED. The various steps of the micro-fabrication method are based on standard manufacturing techniques, for example, epitaxial growth and etching. Furthermore, various different devices are manufactured by changing the order of manufacturing steps, omitting some steps or using different materials. Therefore, it is possible using a same manufacturing equipment for producing a large variety of different imaging devices considerably reducing manufacturing costs.

In accordance with the present invention there is provided a method for micro-fabricating a pixelless thermal imaging device, the imaging device for up-converting a sensed 2-dimensional M/FIR image into a 2-dimensional image in the NIR to visible spectrum in dependence thereupon, the method comprising the steps of:

providing a first substrate, the first substrate having a surface suitable for subsequent crystal growth;

crystallographically growing an integrated QWIP-LED wafer on the surface of the first substrate comprising the steps of:
  growing an etch stop layer;
  growing a bottom contact layer;
  growing a plurality of layers forming a n-type QWIP and a LED; and,
  growing a top contact layer;

providing at the top of the QWIP-LED wafer an optical coupler for coupling at least a portion of incident M/FIR light into modes having an electric field component perpendicular to quantum wells of the QWIP;

removing the first substrate; and, removing the etch stop layer.

In accordance with an aspect of the present invention there is provided a method for micro-fabricating a pixelless thermal imaging device, the imaging device for up-converting a sensed 2-dimensional M/FIR image into a 2-dimensional image in the NIR to visible spectrum in dependence thereupon, the method comprising the steps of:

providing a first substrate, the first substrate having a surface suitable for subsequent crystal growth;

crystallographically growing an integrated QWIP-LED wafer on the surface of the first substrate comprising the steps of:
  growing an etch stop layer;
  growing a bottom contact layer;
  growing a plurality of layers forming a n-type QWIP and a LED; and,
  growing a top contact layer;

providing an optical coupler on the top of the QWIP-LED wafer for coupling at least a portion of incident M/FIR light into modes having an electric field component perpendicular to quantum wells of the n-type QWIP;

patterning a device mesa by removing the layers outside the device mesa down to the bottom contact layer, the device mesa approximately comprising an active area of the thermal imaging device, the active area being approximately the size of the 2-dimensional image;

depositing a top metal contact onto the top contact layer such that the top metal contact forms a ring surrounding the active area;

depositing a bottom metal contact onto the bottom contact layer outside the device mesa;

depositing a coating onto the top surface of the active area;

isolating material defects in the active area of the QWIP-LED;

bonding the QWIP-LED wafer to an optical faceplate such that the QWIP-LED is in optical communication with the optical faceplate for light emitted from the LED;

removing the first substrate; and, removing the etch stop layer.

In accordance with the present invention there is further provided a method for micro-fabricating a pixelless thermal imaging device, the imaging device for up-converting a sensed 2-dimensional M/FIR image into a 2-dimensional image in the NIR to visible spectrum in dependence thereupon, the method comprising the steps of:

providing a first substrate, the first substrate having a surface suitable for subsequent crystal growth;

crystallographically growing on the surface of the first substrate a plurality of layers forming an integrated QWIP-LED wafer;

patterning a device mesa, the device mesa approximately comprising an active area of the thermal imaging device, the active area being approximately the size of the 2-dimensional image; and, isolating material defects in the active area of the QWIP-LED.

In accordance with another aspect of the present invention there is provided a method for micro-fabricating a pixelless thermal imaging device, the imaging device for up-converting a sensed 2-dimensional M/FIR image into a 2-dimensional image in the NIR to visible spectrum in dependence thereupon, the method comprising the steps of:

providing a first substrate, the first substrate having a surface suitable for subsequent crystal growth;

crystallographically growing an integrated QWIP-LED wafer on the surface of the first substrate comprising the steps of:
  growing an etch stop layer;
  growing a bottom contact layer;
  growing a plurality of layers forming a n-type QWIP and a LED; and,
  growing a top contact layer;

patterning a device mesa by removing the layers outside the device mesa down to the bottom contact layer, the device mesa approximately comprising an active area of the thermal imaging device, the active area being approximately the size of the 2-dimensional image;

depositing a top metal contact onto the top contact layer such that the top metal contact forms a ring surrounding the active area;

depositing a bottom metal contact onto the bottom contact layer outside the device mesa;

isolating material defects in the active area of the QWIP-LED;

bonding the top surface of the QWIP-LED wafer to an optical faceplate such that the QWIP-LED is in optical communication with the optical faceplate for light emitted from the LED;

removing the first substrate;

removing the etch stop layer;

providing an optical coupler at the bottom of the QWIP-LED wafer for coupling at least a portion of incident M/FIR light into modes having an electric field component perpendicular to quantum wells of the n-type QWIP; and, bonding the bottom surface of the QWIP-LED wafer to a plate such that the QWIP-LED is in optical communication with the plate for M/FIR light.

BRIEF DESCRIPTION OF THE FIGURES

Exemplary embodiments of the invention will now be described in conjunction with the following drawings, in which:

FIG. 3i is a simplified block diagram schematically illustrating a device structure obtained after manufacturing step i) shown in FIG. 2;

FIG. 3j is a simplified block diagram schematically illustrating a device structure obtained after manufacturing step j) shown in FIG. 2;

FIG. 3k is a simplified block diagram schematically illustrating a device structure obtained after manufacturing step k) shown in FIG. 2;

FIG. 3l is a simplified block diagram schematically illustrating a device structure obtained after manufacturing step l) shown in FIG. 2;

FIG. 3m is a simplified block diagram schematically illustrating a device structure obtained after manufacturing step m) shown in FIG. 2;

FIG. 3n is a simplified block diagram schematically illustrating a device structure obtained after manufacturing step n) shown in FIG. 2;

FIG. 9b is a simplified block diagram schematically illustrating a top view of the diffractional grating shown in FIG. 9a;

FIG. 10b is a simplified block diagram schematically illustrating a top view of the lamellar V-groove structure shown in FIG. 10a;

DETAILED DESCRIPTION OF THE INVENTION

Figure 1:
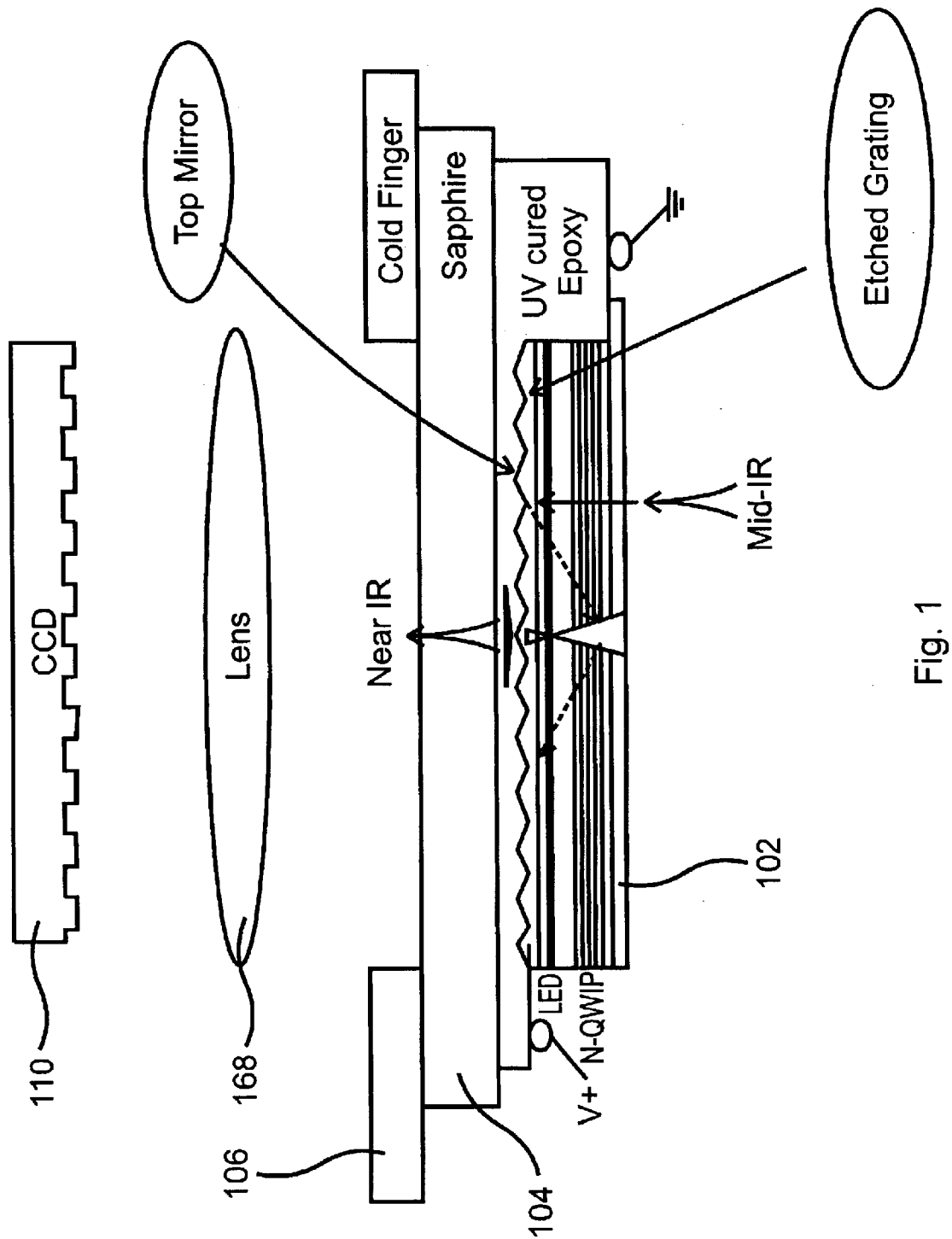
FIG. 1 is a simplified block diagram of a thermal imaging device fabricated using a method for micro-fabricating a pixelless thermal imaging device according to the invention.

FIG. 1 illustrates schematically an example of a completed pixelles IR thermal imaging device based on an epitaxially integrated QWIP-LED 102. The figure is not drawn to scale in order to show better the structure of the device. The horizontal dimension of the QWIP-LED 102 is approximately 1 cm and the dimension of the Sapphire 104 is slightly larger. In the vertical direction the thickness of the QWIP-LED 102 is approximately 3 μm and the thickness of the Sapphire 104 is approximately 1 mm. The Sapphire 104 is connected to a cold finger 106, which is dimensioned such that efficient cooling is provided to keep the imaging device at a predetermined cryogenic operating temperature of approximately 65 K. In FIG. 1 a lens 108 interposed between the Sapphire 104 and a CCD 110 is shown. Instead of the lens it is possible to directly couple the light emitted from the LED to the CCD 110, for example, via a fiber optical faceplate.

The detected infrared spectrum covers the middle and far infrared M/FIR wavelengths. The spectrum emitted by the LED is in the near infrared NIR or visible spectrum, which is possible to detect using a CCD.

Figure 2:
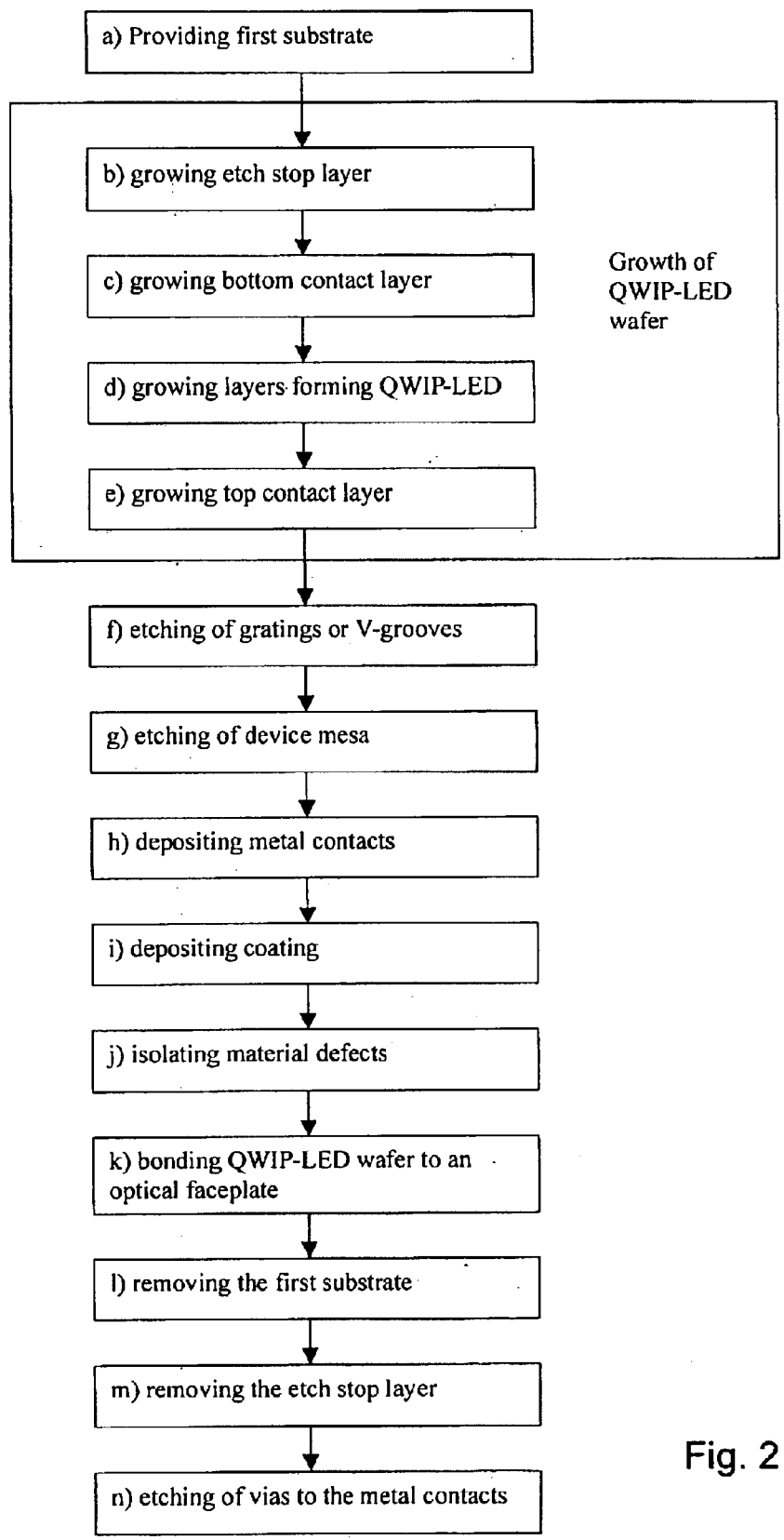
FIG. 2 is a simplified flow diagram of a method for micro-fabricating a pixelless thermal imaging device according to the invention.
Figure 3A:
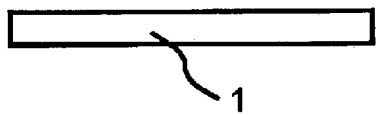
FIG. 3a is a simplified block diagram schematically illustrating a device structure obtained after manufacturing step a) shown in FIG. 2.
Figure 3B:
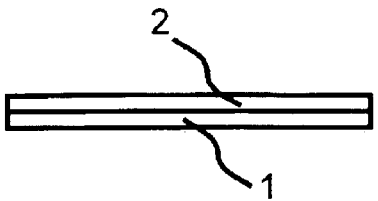
FIG. 3b is a simplified block diagram schematically illustrating a device structure obtained after manufacturing step b) shown in FIG. 2.
Figure 3C:
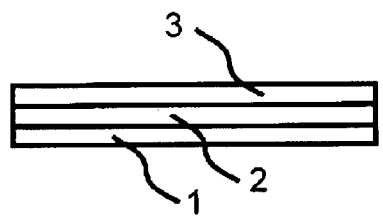
FIG. 3c is a simplified block diagram schematically illustrating a device structure obtained after manufacturing step c) shown in FIG. 2.
Figure 3D:
FIG. 3d is a simplified block diagram schematically illustrating a device structure obtained after manufacturing step d) shown in FIG. 2.
Figure 3E:
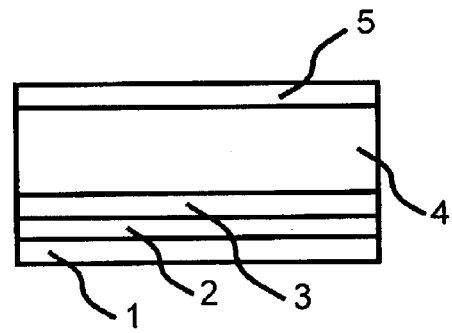
FIG. 3e is a simplified block diagram schematically illustrating a device structure obtained after manufacturing step e) shown in FIG. 2.
Figure 3F:
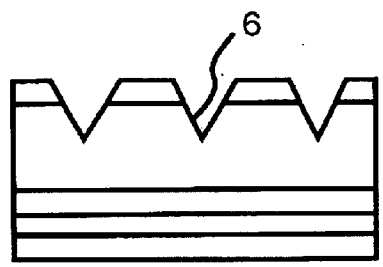
FIG. 3f is a simplified block diagram schematically illustrating a device structure obtained after manufacturing step f) shown in FIG. 2.
Figure 3G:
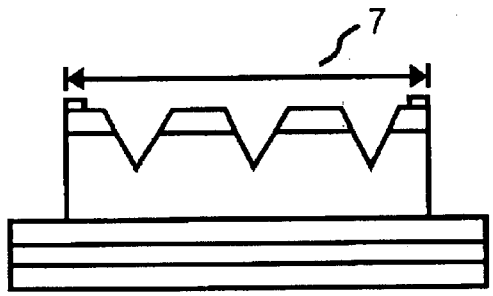
FIG. 3g is a simplified block diagram schematically illustrating a device structure obtained after manufacturing step g) shown in FIG. 2.
Figure 3H:
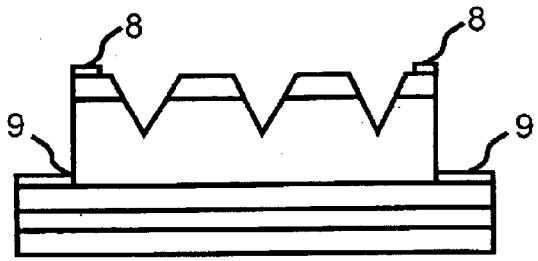
FIG. 3h is a simplified block diagram schematically illustrating a device structure obtained after manufacturing step h) shown in FIG. 2.

Referring to FIG. 2 a simplified flow diagram of the principal steps of a micro-fabrication method of pixelless infrared thermal imaging devices according to the invention is shown. FIGS. 3a–3n illustrate schematically resulting device structures corresponding to the manufacturing steps illustrated in FIG. 2. The micro-fabrication method according to the invention allows the manufacture of numerous different variations of pixelless infrared thermal imaging devices based on the principal steps shown in FIGS. 2 and 3a–3n. The fabrication of the various embodiments of imaging devices differs in the processes performed within each of these principal steps. Moreover, it is possible to change the order of some of the steps or to omit some steps as will be described in the following.

In order to start crystal growth a crystal surface in the form of a first substrate 1 is provided in a first step a). In the following steps b) to e) a QWIP-LED wafer is crystallografically grown on the first substrate 1. The growth of the QWIP-LED wafer starts with the deposition of material forming an etch stop layer 2, step b). The etch stop layer 2 is followed by a bottom contact layer 3 formed in step c). In step d) a plurality of layers 4 forming the QWIP-LED are crystallografically grown on the bottom contact layer 3. In a final step e) the QWIP-LED 4 is covered by a top contact layer 5.

Once the QWIP-LED wafer is grown a grating or V-grooves 6 are etched into the top layers of the wafer covering approximately the entire active surface area of the device, as shown in step f). A device mesa 7 comprising the active surface area is then etched—step g)—into the wafer by removing the material outside the active area down to the bottom contact layer 3. To facilitate electrical contacts an appropriate metal 8, 9 is deposited in step h) on the top contact layer 5 outside the active area near the edge of the device mesa 7 and on the bottom contact layer 3. Following this, a thin coating 10 is deposited on the grating surface or the V-groove facets, shown in step i). Material defects 11 included within the active area cause local shunts giving rise to a current and create a LED emission "hot spot". These hot spots are removed or isolated by short pulse laser ablation, shown in step j). The device is then, step k), coupled to an optically transmissive material such as a fiber optic faceplate 12 using, for example, an optical adhesive 18. In step l) the original substrate 1 is removed by a combination of polishing and etching. The etch is precisely stopped at the etch stop layer 2. The etch stop layer 2 is then also removed—step m). The device micro-fabrication is finished after etching of via holes 13, 14 to the top 8 and bottom 9 contacts in step n). The device is then ready for mounting on a chip carrier and for wire bonding for electrical connection.

Figure 4:
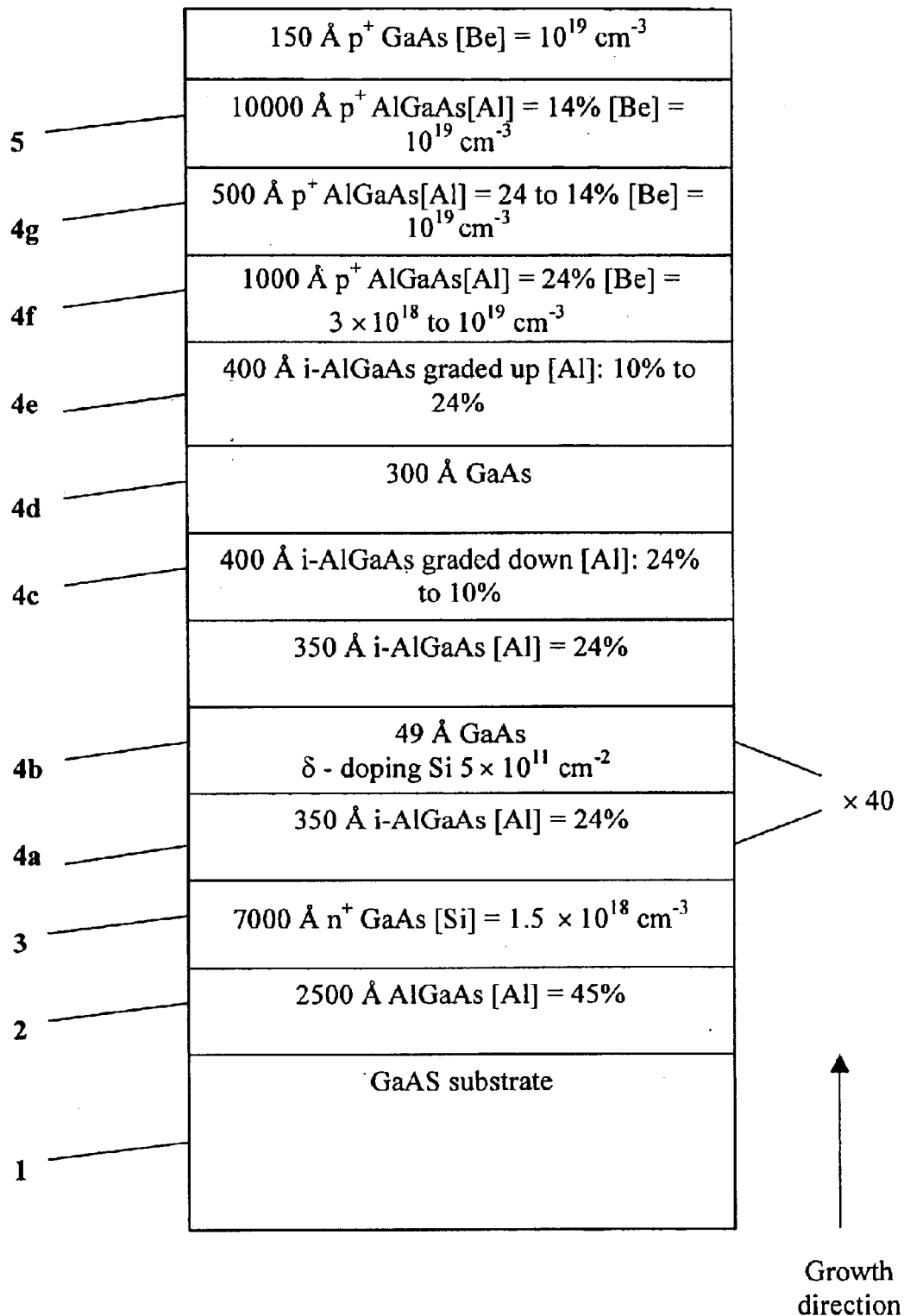
FIG. 4 is a simplified block diagram schematically illustrating the structure of a n-type QWIP-LED wafer micro-fabricated using a method according to the invention.
Figure 5A:
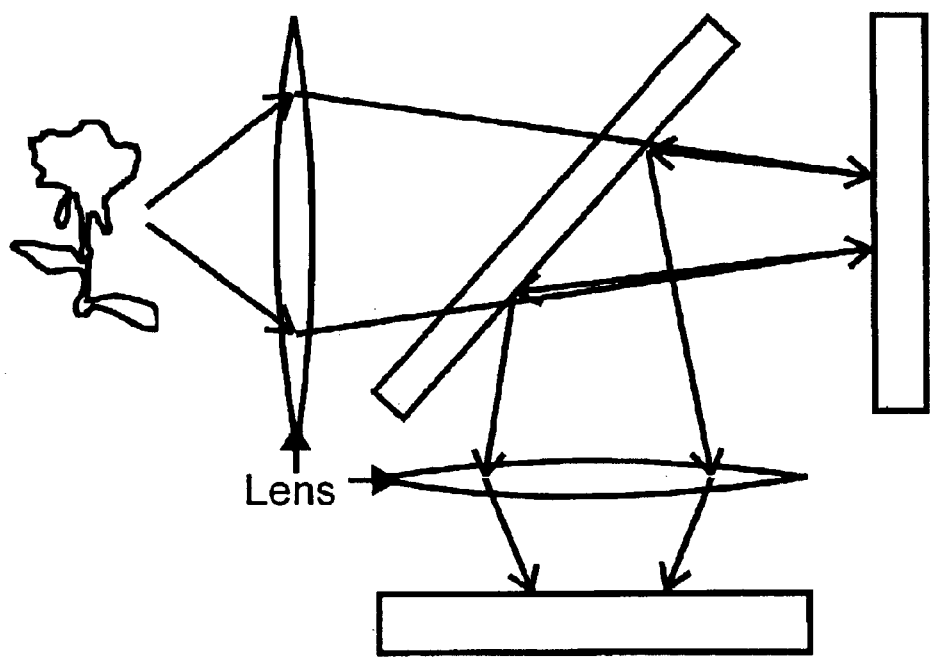
FIG. 5a is a simplified block diagram schematically illustrating the incorporation of a QWIP-LED wafer micro-fabricated using a method according to the invention in a thermal imaging device operating in a reflective mode.
Figure 5B:
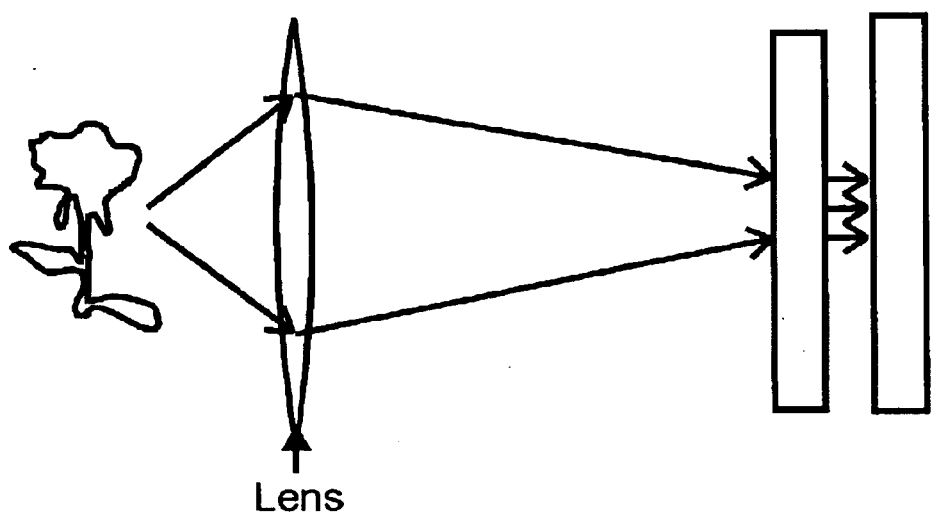
FIG. 5b is a simplified block diagram schematically illustrating the incorporation of a QWIP-LED wafer micro-fabricated using a method according to the invention in a thermal imaging device operating in a transmissive mode.

FIG. 4 illustrates an example of grown layers forming a QWIP-LED wafer. The layers are, for example grown on a semi-insulating GaAs substrate 1 using molecular beam epitaxy. As is evident, the fabrication method according to the invention is not limited thereto and a person of skill in the art will find numerous methods applicable for growing the layers, for example, Metal Organic Chemical Vapor Deposition (MOCVD), as well as numerous materials suitable as a first substrate. The first layer grown on the first substrate 1 is the etch stop layer 2. The etch stop layer 2 shown in FIG. 4 comprises a 2500 Å thick layer of AlGaAs with an alloy fraction [Al]=45%. The etch stop layer 2 protects the bottom contact layer 3 during the substrate removal process, step l), which will be described later. Thickness and material composition of the etch stop layer 2 are chosen depending on the substrate removal process used. For some embodiments of imaging devices it is possible to omit the etch stop layer 2. For example, imaging devices operating in a reflective mode as shown in FIG. 5a do not need removal of the first substrate 1. Furthermore, it is also possible to omit removal of the first substrate 1 in imaging devices operating in a transmissive mode, shown in FIG. 5b, if an undoped substrate is used. In order to facilitate electrical connection to the micro-fabricated device a $n^+$ bottom contact layer 3 is grown, step c), on the etch stop layer 2. The $n^+$ bottom contact layer 3 shown in FIG. 4 comprises a 7000 Å thick layer of GaAs. A stack of layers forming multiple quantum wells of the QWIP follows the contact layer. As shown in FIG. 4a the quantum wells comprise a 40 times repeat of a 350 Å thick i-AlGaAs barrier 4a followed by a 49 Å thick Si center doped GaAs quantum layer 4b giving rise to a two-dimensional carrier density of $5 \times 10^{11}$ cm$^{-2}$. Here, the GaAs layer is doped using Si in order to form a n-QWIP. Alternatively, doping of the GaAs layer with Be provides a p-QWIP as will described below. Growth is continued with the LED constituents: a 400 Å thick $Al_xGa_{1-x}As$ graded layer 4c with x=0.24 at the beginning and decreasing to x=0.1 at the end followed by a 300 Å thick GaAs well 4d, a 400 Å thick $Al_xGa_{1-x}As$ graded layer 4e with x=0.1 at the beginning and increasing to x=0.24 at the end, a 1000 Å thick $p^+$-$Al_{0.24}Ga_{0.76}$ layer 4f doped to a Be graded concentration varying from $3 \times 10^{18}$ cm$^{-3}$ at the beginning to $10^{19}$ cm$^{-3}$ at the end, and a 500 Å thick $p^+$-$Al_xGa_{1-x}As$ graded layer 4g with x=0.24 at the beginning and x=0.14 at the end and doped to a Be concentration of $10^{19}$ cm$^{-3}$. The growth process is concluded by a 1000 Å thick $p^+$-$Al_{0.14}Ga_{0.86}As$ top contact layer 5 doped to a Be concentration of $10^{19}$ cm$^{-3}$ and a 150 Å thick p$^+$-GaAs cap layer doped to the same level.

The fabrication method according to the invention allows the manufacture of many variations, for example, by changing the QWIP quantum well parameters such as materials used for growing the layers forming the QWIP, the thickness of each of the layers as well as the number of repeated layers. Furthermore, change of the LED layers, for example, use of InGaAs instead of GaAs, and change of the thickness of each of the layers allows variation of the LED to have a different emission wavelength in the NIR or visible spectrum and to fine tune transport and recombination processes within the LED affecting overall performance of the device. For example, the exemplary thermal imaging device based on the structure shown in FIG. 4 has a QWIP detection peak wavelength of about 9 μm and a LED emission wavelength of about 800 nm at a operating temperature of about 65 K.

Various embodiments of the growth process—steps a) to e)—of the micro-fabrication method according to the invention will be disclosed in the following. Provision of a n$^+$ substrate as the first substrate allows omission of the etch stop layer 2 as well as the bottom contact layer 3 for some thermal imaging devices such as, for example, imaging devices based on a reflective QWIP-LED geometry as shown in FIG. 5a. In another embodiment an additional layer, for example a 21000 Å thick AlGaAs layer, is grown on top of the top contact layer 5. This layer is designed to facilitate the fabrication of transmission grating couplers, which will be explained below. In another embodiment the thickness of the LED active region—layer 4d—is increased in order to use photon recycling effects for improving the external efficiency of the imaging device. However, carrier diffusion resulting in a spatial smearing of an incoming M/FIR image during its transformation into the NIR emission range limits the maximum thickness of the LED active region to about 1 μm in order to provide an imaging device having a sufficient spatial resolution.

Figure 6:
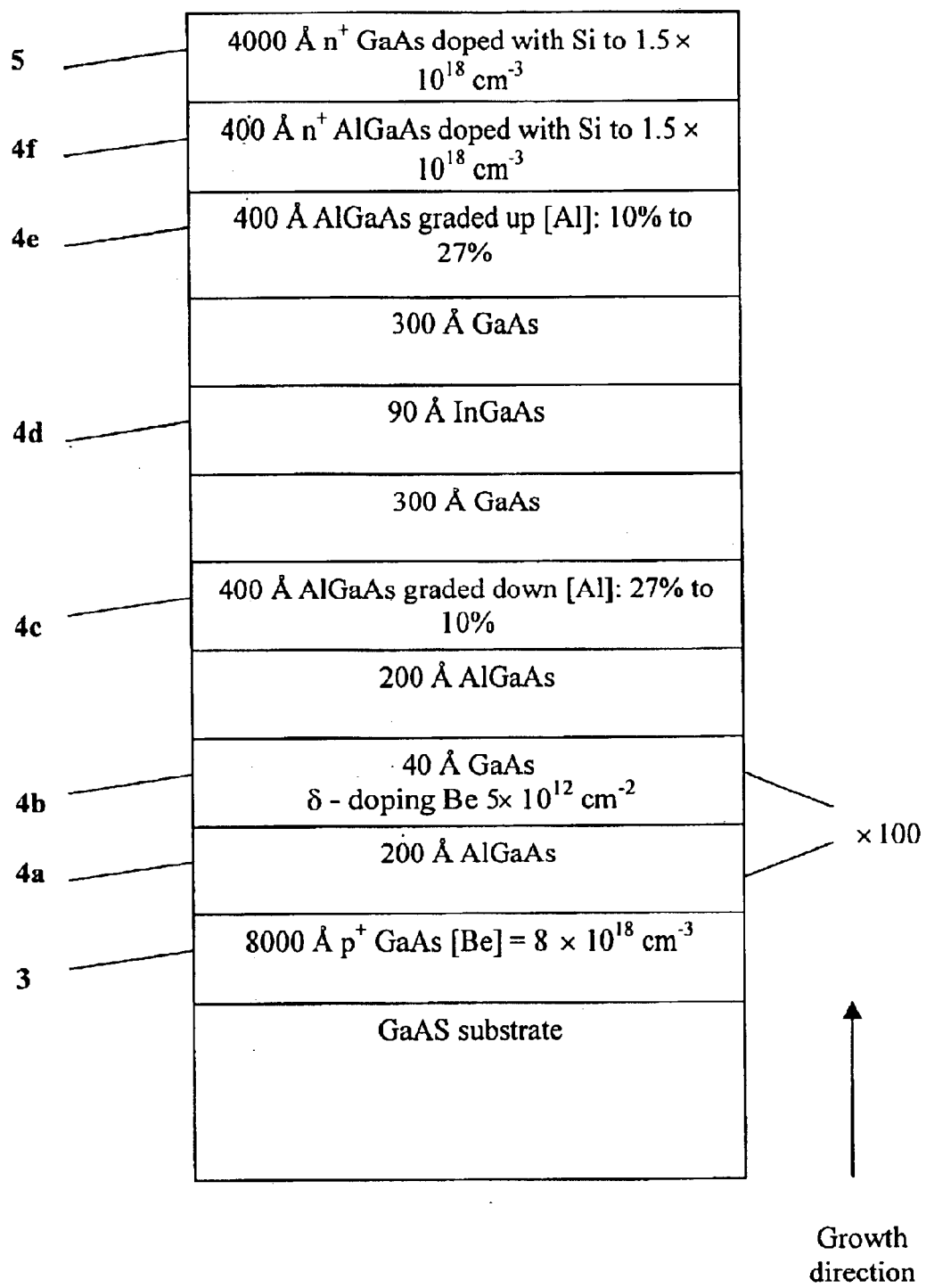
FIG. 6 is a simplified block diagram schematically illustrating the structure of a p-type QWIP-LED wafer micro-fabricated using a method according to the invention.

Referring to FIG. 6 another embodiment of a QWIP-LED wafer is shown. The wafer comprises a p-type GaAs/AlGaAs QWIP combined with an InGaAs/GaAs LED. Use of a p-QWIP permits normal incidence excitation thus avoiding the need for a grating coupler as required for n-type devices. Here, the bottom contact layer 3 comprises a p$^+$-GaAs contact layer doped with Be. It is followed by the multiple quantum well growth comprising a repeat of a AlGaAs barrier 4a followed by a Be center doped GaAs well 4b. Growth is then continued with the LED constituents: a graded Al$_x$Ga$_{1-x}$As layer 4c with x=0.27 at the beginning and decreasing to x=0.1 at the end followed by a InGaAs well 4d, a graded Al$_x$Ga$_{1-x}$As layer 4e with x=0.1 at the beginning and increasing to x=0.27 at the end, and a n$^+$-Al$_{0.27}$Ga$_{0.73}$ layer 4f doped with Si to a concentration of $1.5\times10^{18}$ cm$^{-3}$. The growth process is concluded by a n$^+$-GaAs top contact layer 5 again doped with Si to a concentration of $1.5\times10^{18}$ cm$^{-3}$.

Figure 7:
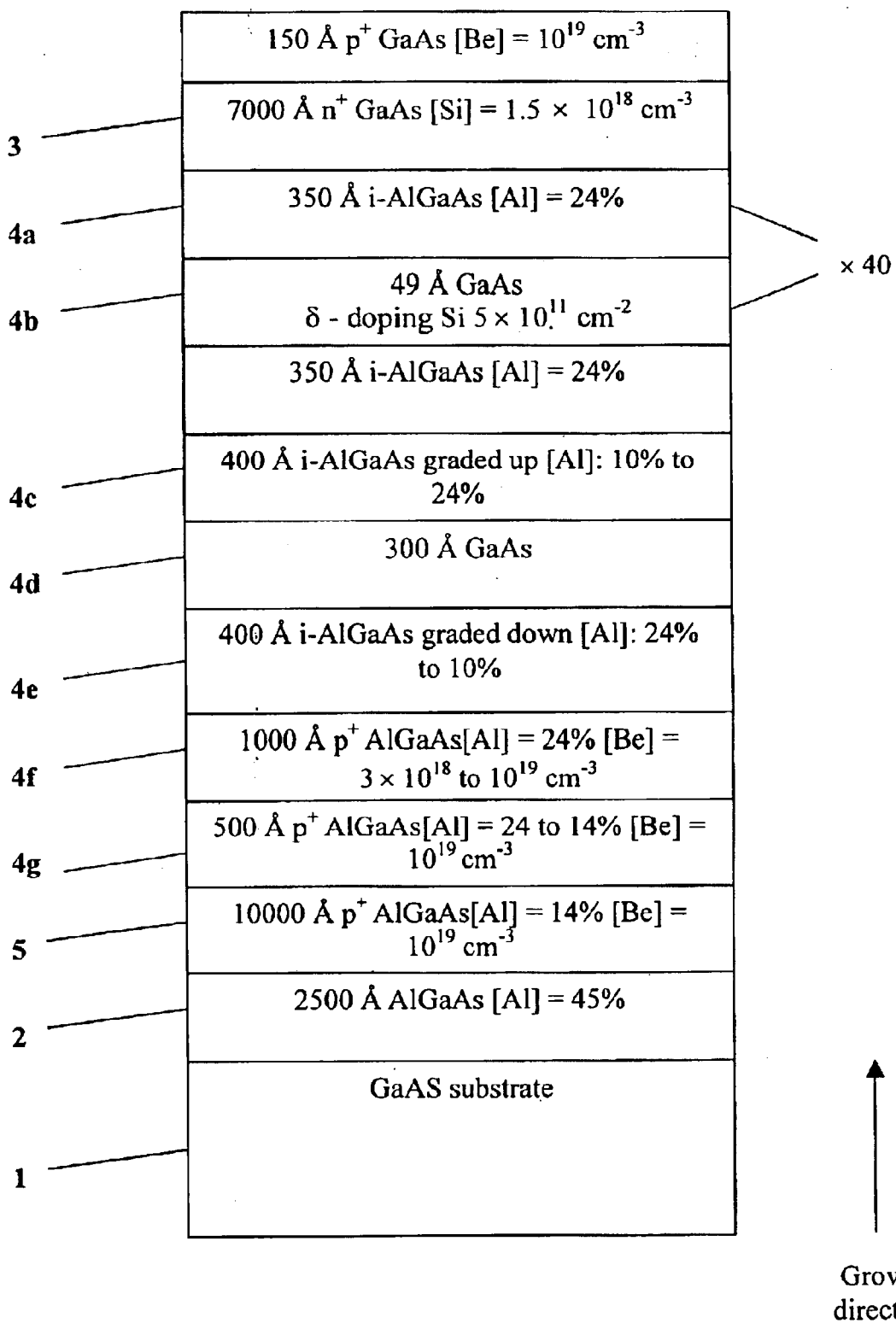
FIG. 7 is a simplified block diagram schematically illustrating the structure of another n-type QWIP-LED wafer micro-fabricated using a method according to the invention.

Referring to FIG. 7 yet another embodiment of a QWIP-LED wafer is shown. Here, the layers 3 to 5 shown in FIG. 4 are reversed, i.e. the bottom contact layer comprises a p$^+$ contact layer followed by the layers forming the LED. The growth process is then continued forming the layers of the QWIP and concluded by forming a n$^+$ top contact layer.

Figure 8:
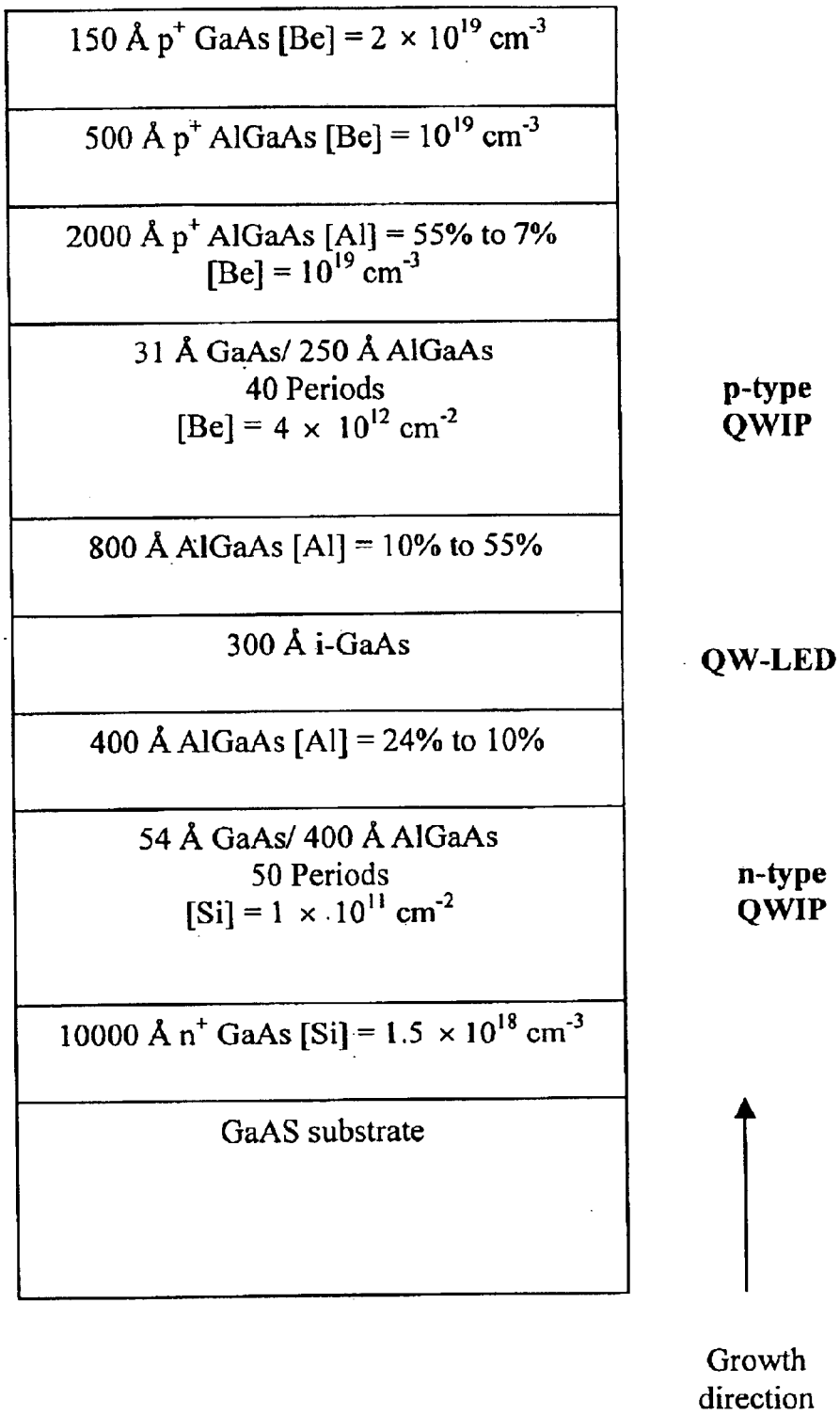
FIG. 8 is a simplified block diagram schematically illustrating the structure of a n-type QWIP/LED/p-type QWIP wafer micro-fabricated using a method according to the invention.

FIG. 8 shows a QWIP-LED wafer comprising grown layers forming a combination of a n-QWIP and a p-QWIP with layers forming a LED interposed in between. Such a device is manufactured based on the same micro-fabrication method as the embodiments disclosed above. As shown above all layers are successively grown on a provided first substrate forming a QWIP-LED wafer. The combination of a n-QWIP and a p-QWIP allows sequential detection of M/FIR images at two different wavelengths by switching the bias voltage between a high and a low value. For example, the imaging device based on the layers shown in FIG. 8 allows sequential detection of images at wavelengths of approximately 9 μm and 5 μm.

Figure 9A:
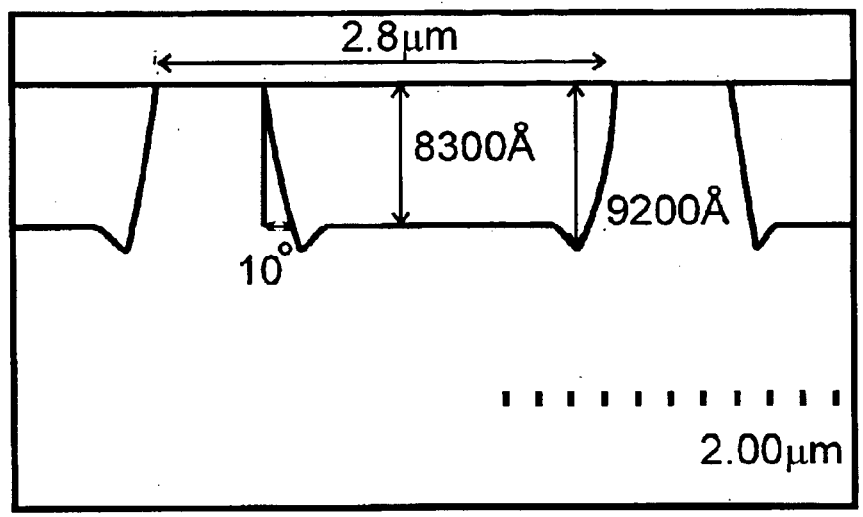
FIG. 9a is a simplified block diagram schematically illustrating a cross sectional view of a diffractional grating.
Figure 9B:
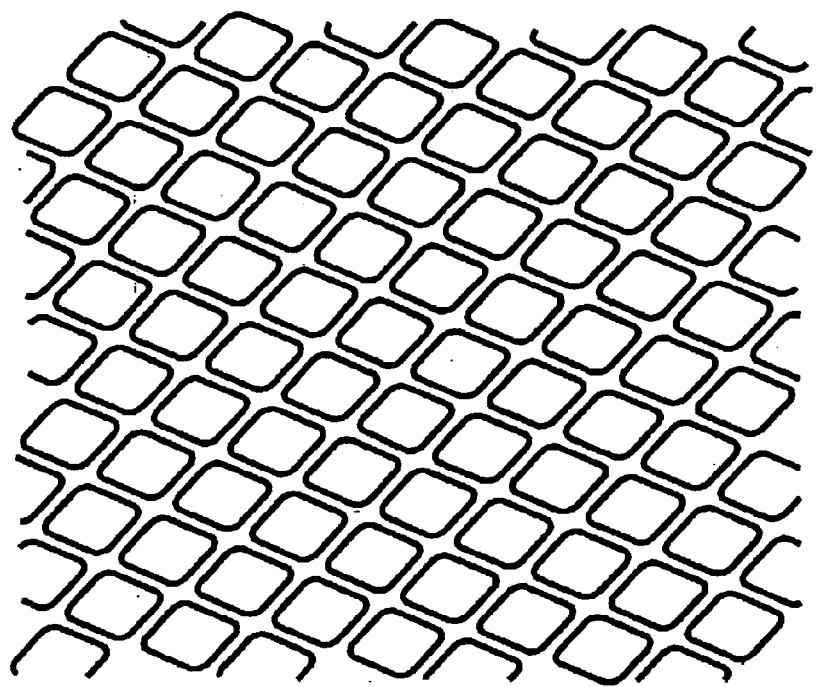
Figure 10A:
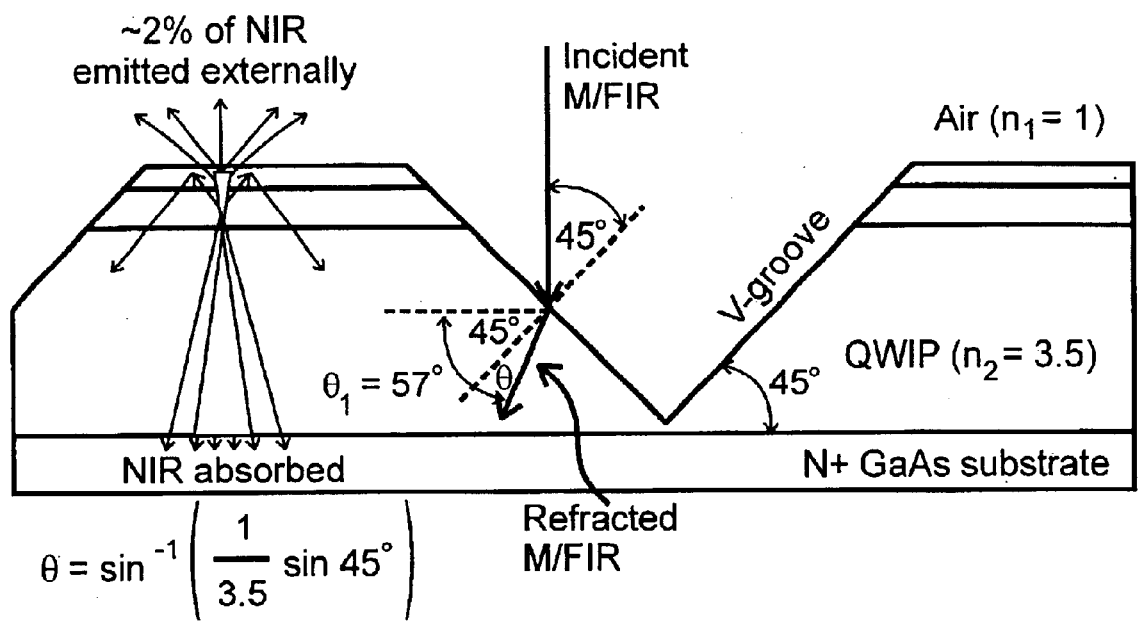
FIG. 10a is a simplified block diagram schematically illustrating a cross sectional view of a lamellar V-groove structure.
Figure 10B:
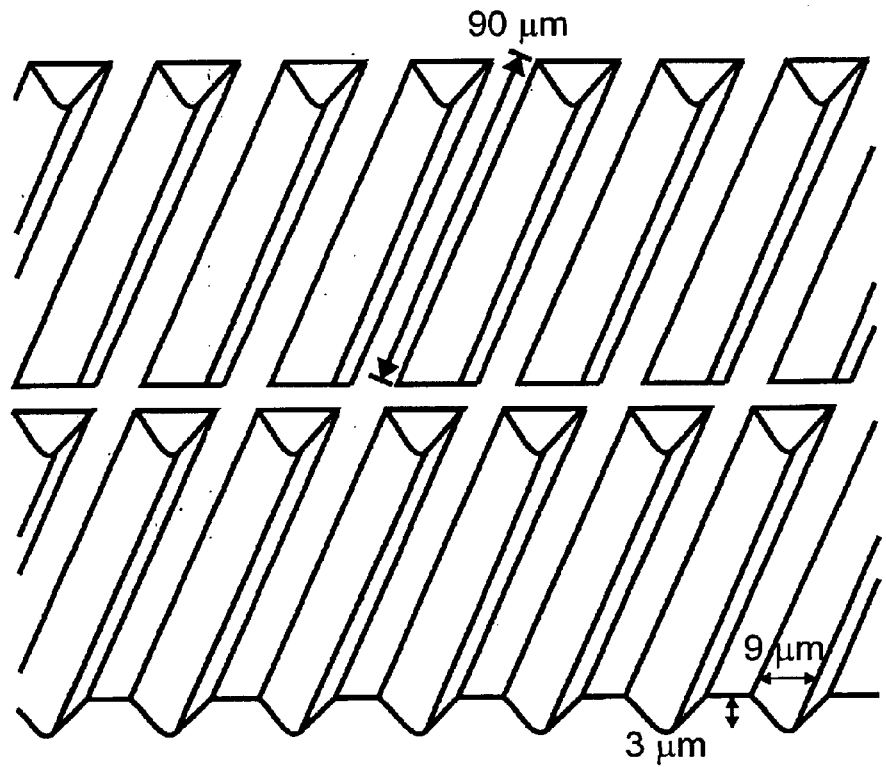

N-type QWIPs respond mainly to the longitudinal component of the optical electric field, i.e. the field along the growth direction. Therefore, an optical coupling structure, such as a diffraction grating or lamellar V-grooves, is required to scatter or diffract normally incident light into modes with an electric field component perpendicular to the quantum wells. FIGS. 9a and 9b show schematically a grating for the QWIP-LED wafer illustrated in FIG. 4. The left picture is an aerial view and the right picture illustrates a cross section. The dimensions shown in FIG. 9a are suited for this particular wafer having a 9 μm wavelength response. Using photo-lithography and etching, for example, chemically assisted ion beam etching, the grating is patterned into the top layers of the QWIP-LED wafer. As is obvious, many shapes and sizes are possible such as for example, etching of a grid leaving elevated islands for diffracting normally incident light. Furthermore, instead of an etched grating metal grids or metal dots are deposited on the top layer. Alternatively, a V-groove structure as shown in FIGS. 10a and 10b is patterned into the QWIP-layers of the QWIP-LED wafer. Experimental results showed that a V-groove structure etched through the LED active region leads to considerably lower Electro-Luminescent (EL) emissions of the LED. Therefore, it is preferred not to etch a grating or V-grooves into the LED active region. In order to avoid surface contamination prior etching of the fine structures it is preferred to perform this step immediately after the growth of the QWIP-LED wafer as shown FIG. 2.

In step g) a device mesa 7 comprising the active surface area is etched into the wafer by removing the material outside the active area down to the bottom contact layer 3. The mesa area 7 is approximately the size of a sensed 2-dimensional image. The mesa area 7 for imaging devices produced using the micro-fabrication method according to the invention was approximately 10.2 mm×10.2 mm and was etched using standard GaAs lithography techniques. Of course, various sizes of the mesa area 7 are possible to produce using the micro-fabrication method according to the invention in order to meet application requirements.

To facilitate electrical connection to the top contact layer 5 an appropriate metal 8 is deposited in a narrow ring shape with a pad for wire bonding on the top part of the mesa 7 near the edge. Analogous, an appropriate metal 9 is deposited onto the bottom contact layer 3 in a large area around the mesa 7. Appropriate metals are for example, TiPtAu for a p-type connection and sintered NiGeAu for n-type contacts.

Figure 11:
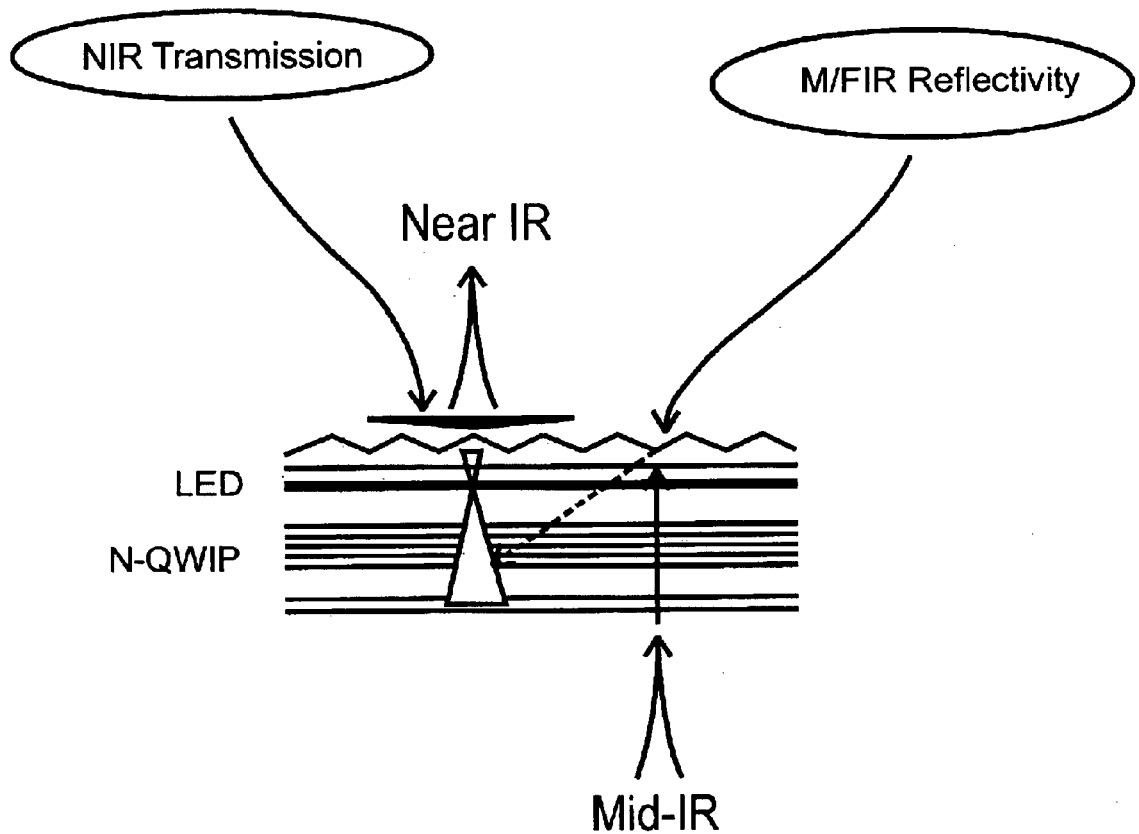
FIG. 11 is a simplified block diagram schematically illustrating a n-type QWIP-LED with a grating and reflective coating on the top surface micro-fabricated using a method according to the invention.

In applications where the QWIP-LED wafer is used in an imaging device operating in a transmissive mode M/FIR light is received at the bottom of the wafer and NIR light is provided through the top surface of the wafer, as shown in FIG. 11. A thin coating 10 is deposited on the grating surface 6 to provide reflection in the M/FIR and at the same time sufficient transmission in the NIR. Suitable coatings are, for example, a thin gold film or a multi-layer dielectric Indium Tin Oxide (ITO) film. Thin layers of noble metals are good reflectors in the M/FIR and are partially transparent in the NIR. In the case of V-grooves patterned into the top layers of the wafer for bending the M/FIR light the V-groove facets are coated with a low index material having a small absorption coefficient in the M/FIR, for example $CaF_2$ or $MgF_2$. The coating minimizes M/FIR radiation absorption in the optical adhesive caused by the fringing optical electrical field by optically decoupling the GaAs from the adhesive. Even if the M/FIR light undergoes total internal reflection at a facet of the V-grooves, the optical electrical field in fact extends beyond the GaAs/adhesive interface and is then absorbed in the adhesive.

Alternatively, when the QWIP-LED wafer is used in an imaging device operating in a reflective mode—FIG. 5a—a coating being reflective for M/FIR as well as for NIR is preferred.

Figure 12A:
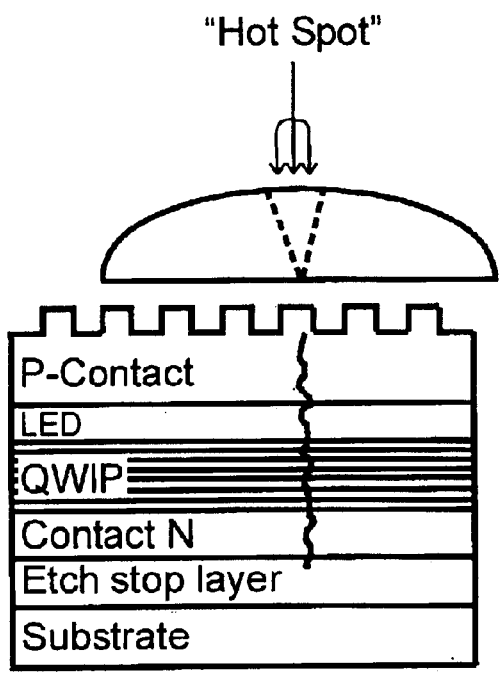
FIG. 12a is a simplified block diagram schematically illustrating a material defect in a QWIP-LED.
Figure 12B:
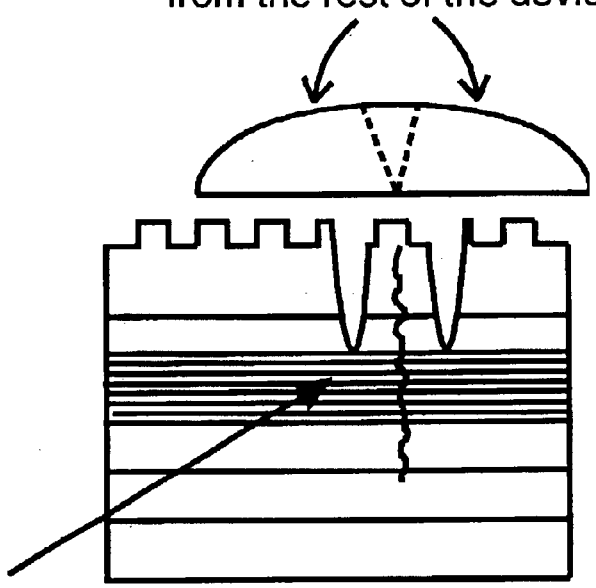
FIG. 12b is a simplified block diagram schematically illustrating isolation of the material defect in a QWIP-LED shown in FIG. 12a using short pulse laser ablation as a processing step in a method according to the invention.
Figure 12C:
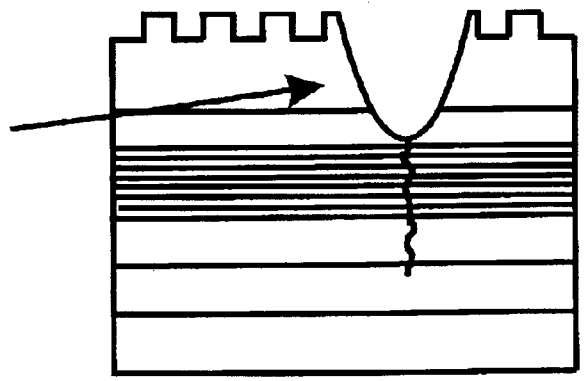
FIG. 12c is a simplified block diagram schematically illustrating isolation of the material defect in a QWIP-LED shown in FIG. 12a using short pulse laser ablation as a processing step in a method according to the invention.

FIG. 12a shows a QWIP-LED wafer having a material defect 11 included within the active area. In the production of large area devices it is next to impossible to avoid inclusion of one or more material defects within the active area without substantially increasing manufacturing costs by either using more expensive and/or time consuming manufacturing processes or by discarding a majority of the production due to material defects. The material or crystallographic defects locally short circuit the large area device at low temperature causing a local shunt. The local shunt is giving rise to a current creating a LED emission "hot spot", which is considerably disturbing the NIR image provided by the QWIP-LED wafer. Typically, devices produced using currently available production techniques have approximately 30 hot spots/cm$^2$. The hot spots are removed by isolating the material defects using short pulse laser ablation, for example, femtosecond laser ablation at a temperature of 63 K. FIGS. 12b and 12c show the isolation of material defects by patterning a trench surrounding the top portion of the defect or by removing the top portion of the defect by patterning a crater using short pulse laser ablation. Details concerning the short pulse laser ablation technique are disclosed by the inventor in Provisional U.S. patent application Ser. No. 60/177,674, and in E. Dupont, X. Zhu, S. Chiu, S. Moisa, M. Buchanan, M. Gao, H. C. Liu, P. B. Corkum, Semiond. Sci. Technol. 15, L15 (2000).

The QWIP-LED wafer is then bonded to an optical faceplate such as a Sapphire plate or a fiber optical face plate using an optical adhesive, for example, UV and/or heat cured epoxy. Optionally, the QWIP-LED wafer is bonded direct to a NIR detector such as a CCD using a heat cured adhesive because both GaAs and Si forming the CCD are opaque to UV light. Requirements for the adhesive include: optical transparency at the LED emission wavelength, good long-term performance at cryogenic temperatures, tolerance to thermal cycling, resistance to etchants and solvents, strong bond formation between the faceplate and GaAs, and good curing behaviors such as low shrinkage. Since the QWIP-LED wafer operates at temperatures <80 K to reduce dark current, the optical adhesive is required to retain its optical and structural integrity at cryogenic temperatures. Also, since device fabrication steps include processing on the opposite side of the wafer the adhesive is exposed to a photoresist bake temperature of ~120° C. Furthermore, low shrinkage during the curing process minimizes the strain acting on the device.

After bonding of the wafer to the optical faceplate but before curing of the adhesive the unbonded side of the wafer is moved into an approximately parallel orientation to the unbonded side of the faceplate. Preferably, in order to achieve a higher order of parallelism and to control the thickness of the adhesive a contact mask aligner is used to press the wafer to the faceplate.

Optionally, the bonded side of the faceplate is coated with a dielectric coating having a refractive index being between the refractive index of the faceplate and the refractive index of the adhesive for the wavelength of the LED emission in order to reduce Fabry Peyrot reflection due to unparallelism between the bonded side of the faceplate and the bonded side of the wafer.

When the wafer is bonded directly to a CCD the effect of the adhesive on the escape probability of the LED emission as a result of the difference in indexes of refraction between the adhesive and the GaAs is minimized if the thickness of the optical adhesive layer is less than the wavelength of the LED emission. The bonding strength of such a thin adhesive layer is still sufficient.

During the bonding process care is taken in order to avoid incorporation of bubbles in the adhesive to prevent complications associated with stress induced by air bubbles shrinking and expanding during thermal cycling. Often visible air bubbles are observed in the adhesive after mixing. It is, therefore, preferred to use an adhesive that does not require a mixing step. It has been observed that bubbles are also incorporated into the adhesive at the moment of bonding. Using a special developed "leveler" to slowly and reproducibly bring the surfaces, which are to be bonded, in contact with the adhesive, eliminated the bubble inclusion.

After the full cure, the first substrate 1 of the QWIP-LED is polished to a thickness of ~80–50 $\mu$m using precision lapping and polishing machines. For example, a 3 $\mu$m slurry is first used to grind the substrate down to ~60 $\mu$m and then a 0.3 $\mu$m slurry is used to polish off an additional 5–10 $\mu$m and to provide a mirror like surface. Optionally, if the 3 $\mu$m slurry is used it is possible to skip the 0.3 $\mu$m step, since the etch stop layer 2 will tolerate a 3 $\mu$m surface roughness. The remaining ~50 $\mu$m substrate 1 is then removed using wet etch techniques. The substrate surface is first etched by a 45 s dip in a 1:10 $NH_4OH:H_2O$ solution to remove surface oxides followed by a 4:1 citric acid solution (1:1 citric acid:$H_2O$):hydrogen peroxide solution (30% $H_2O_2$) of wet etch to completely remove the substrate. The etch is precisely stopped at the etch stop layer 2. The etch stop layer 2 first grown on the first substrate 1 is determined to tolerate small thickness variations—up to 10 $\mu$m—in the remaining ~80–50 $\mu$m substrate after polishing. The etch stop layer 2 is then also removed using concentrated hydrofluoric acid (49%). Of course, numerous other methods to remove the substrate are applicable as is evident to the person of skill in the art. For example, it is possible to skip the polishing step and to remove the whole substrate using an etching technique. However, this process has the disadvantage that it requires long processing times for completely removing the substrate. More details concerning the substrate removal are disclosed by the inventor in S. Chiu, M. Buchanan, E. Dupont, C. Py, H. C. Liu, Infrared Physics & Technology 41 (2000) 51–60.

Figure 13:
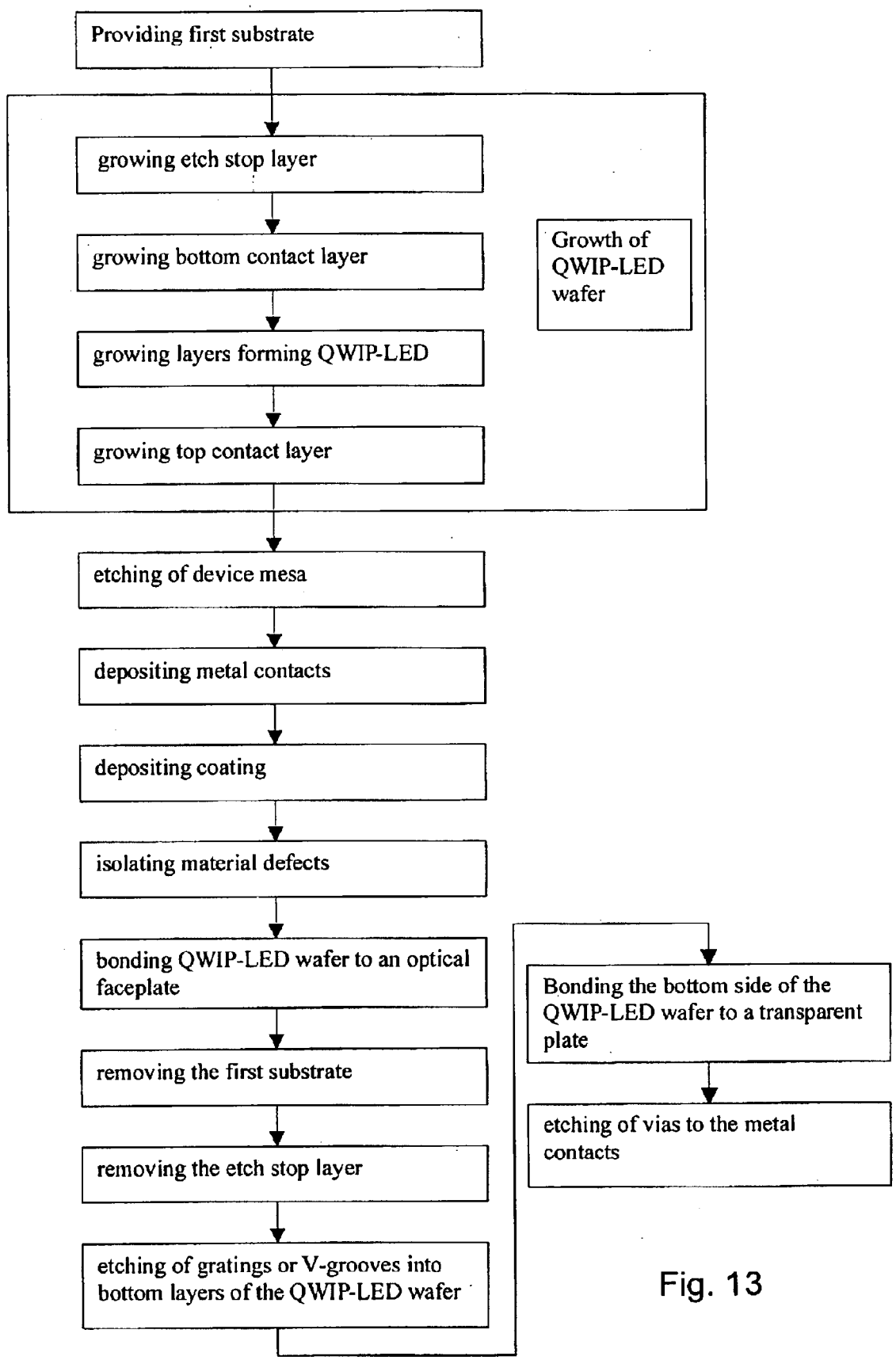
FIG. 13 is a simplified flow diagram of another method for micro-fabricating a pixelless thermal imaging device according to the invention; and, FIG. 14a is a simplified block diagram schematically illustrating a pixelless infrared imaging device manufactured using the methods for micro-fabrication according to the invention.

Referring to FIG. 13, an alternative embodiment of the micro-fabrication method according to the invention is shown. Here, the step f) of etching of a grating into the top layers is replaced by etching the grating into the bottom layers—the entrance side of the M/FIR radiation—of the QWIP-LED wafer after substrate removal. The M/FIR entrance side is then bonded using a M/FIR non-absorbing adhesive to a M/FIR transparent substrate such as GaAs or ZnSe. In these applications the grating works in a transmissive mode.

To improve the LED efficiency, a coating on the entrance side of the M/FIR—bottom side of the wafer—is deposited. The coating is transmissive in the M/FIR and reflective in the NIR to visible spectrum. For example, a stack of 8 layers of ThF$_4$/ZnSe with total thickness of ~1.1 μm has the required characteristics.

It is also possible to incorporate the reflector during epitaxial growth, for example, by growing a distributed Bragg reflector (DBR) after growth of the etch stop layer 2 and before growing the bottom contact layer 3. Preferably, the distance between the LED active region and the first layer of the DBR is chosen to be half the LED emission wavelength in order to fully use interference effects.

Optionally, the substrate removal process is obviated if V-grooves and an absorbing semiconductor substrate at the LED wavelength—for example, GaAs LED and a GaAs substrate—are combined. Furthermore, using V-grooves above the active layer of the LED act as a microlens and, therefore, enhance the LED emission.

As is evident, the micro-fabrication method according to the invention allows manufacture of various different thermal imaging devices using numerous different material systems such as an InGaAs well combined with an AlGaAs barrier or an InGaAs well combined with an InP barrier, both grown on InP substrates. This allows manufacture of QWIP-LEDs operating at different detection wavelengths as well as different emission wavelengths.

The micro-fabrication method according to the invention is highly advantageous by allowing manufacture of numerous different infrared thermal imaging devices based on epitaxial integration of a QWIP with a LED. The various steps of the micro-fabrication method is based on standard manufacturing techniques, for example, epitaxial growth and etching. Furthermore, various different devices are manufactured by changing the order of manufacturing steps, omitting some steps or using different materials. Therefore, it is possible using a same manufacturing equipment for producing a large variety of different devices considerably reducing manufacturing costs.

Figure 14A:
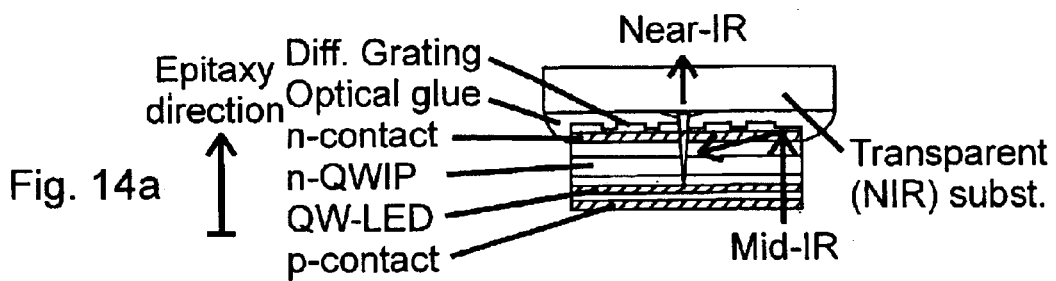
FIG. 14b is a simplified block diagram schematically illustrating a pixelless infrared imaging device manufactured using the methods for micro-fabrication according to the invention.
FIG. 14c is a simplified block diagram schematically illustrating a pixelless infrared imaging device manufactured using the methods for micro-fabrication according to the invention.
FIG. 14d is a simplified block diagram schematically illustrating a pixelless infrared imaging device manufactured using the methods for micro-fabrication according to the invention.
FIG. 14e is a simplified block diagram schematically illustrating a pixelless infrared imaging device manufactured using the methods for micro-fabrication according to the invention.
FIG. 14f is a simplified block diagram schematically illustrating a pixelless infrared imaging device manufactured using the methods for micro-fabrication according to the invention.
FIG. 14g is a simplified block diagram schematically illustrating a pixelless infrared imaging device manufactured using the methods for micro-fabrication according to the invention.
FIG. 14h is a simplified block diagram schematically illustrating a pixelless infrared imaging device manufactured using the methods for micro-fabrication according to the invention.
FIG. 14i is a simplified block diagram schematically illustrating a pixelless infrared imaging device manufactured using the methods for micro-fabrication according to the invention.
FIG. 14j is a simplified block diagram schematically illustrating a pixelless infrared imaging device manufactured using the methods for micro-fabrication according to the invention.
FIG. 14k is a simplified block diagram schematically illustrating a pixelless infrared imaging device manufactured using the methods for micro-fabrication according to the invention.
FIG. 14l is a simplified block diagram schematically illustrating a pixelless infrared imaging device manufactured using the methods for micro-fabrication according to the invention; and, FIG. 14m is a simplified block diagram schematically illustrating a pixelless infrared imaging device manufactured using the methods for micro-fabrication according to the invention.
Figure 14B:
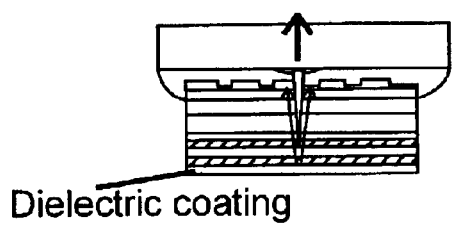
Figure 14C:
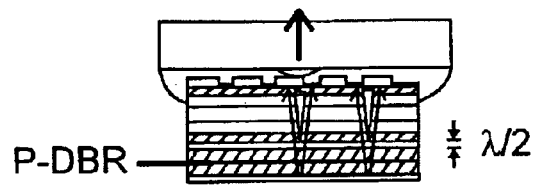
Figure 14D:
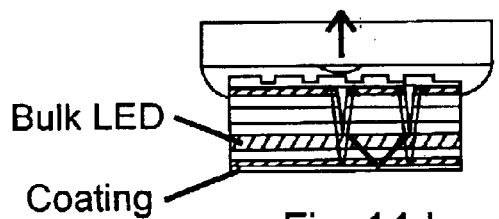
Figure 14E:
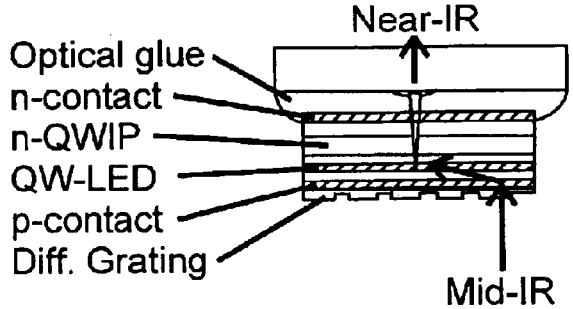
Figure 14F:
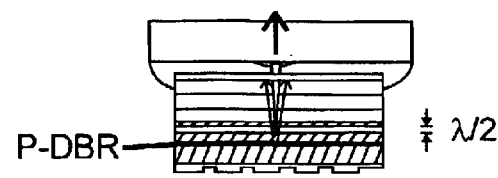
Figure 14G:
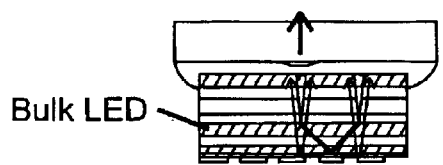
Figure 14H:
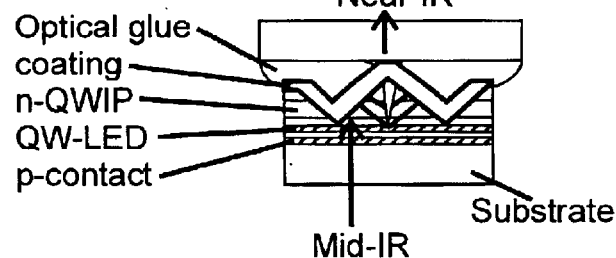
Figure 14I:
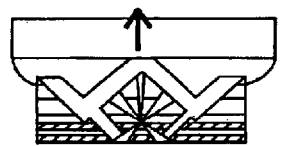
Figure 14J:
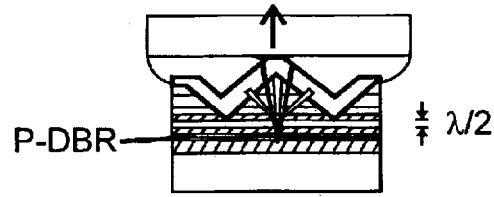
Figure 14K:
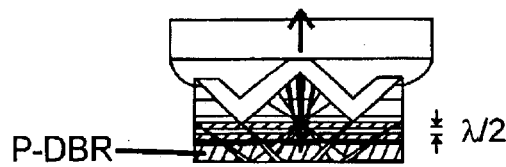
Figure 14L:
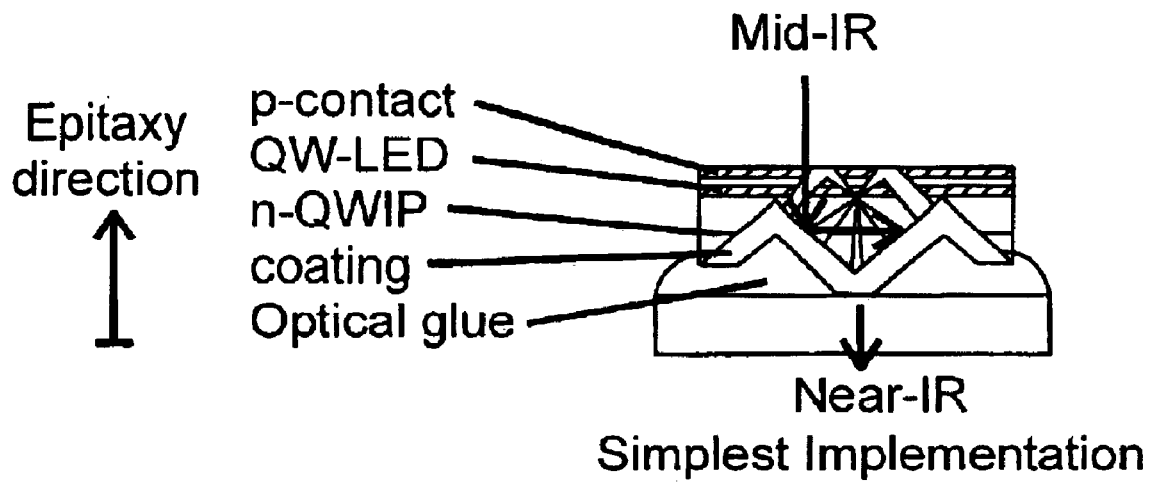
Figure 14M:
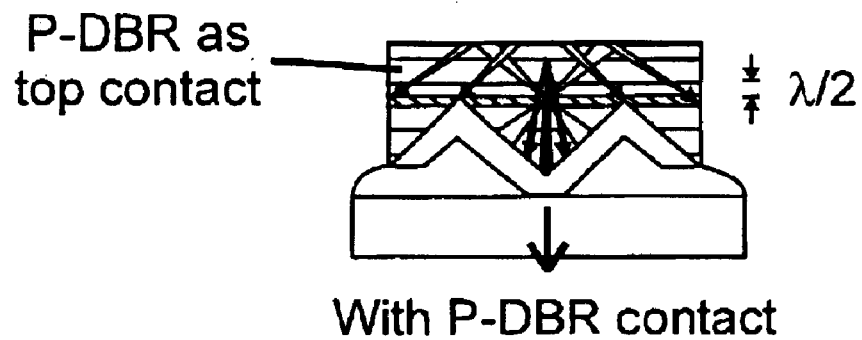

FIGS. 14*a* to 14*m* illustrate schematically the principal structure of various examples of imaging devices manufactured using the micro-fabrication method according to the invention. The examples illustrated in FIGS. 14*a* to 14*d* are produced based on the micro-fabrication method according to the invention shown in FIG. 2 and some modifications of this method as described above. The examples illustrated in FIGS. 14*e* to 14*f* are based on the micro-fabrication method shown in FIG. 13. The examples illustrated in FIGS. 14*g* to 14*k* are again based on the method shown in FIG. 2 replacing the gratings with V-grooves, wherein examples illustrated in FIGS. 14*h* and 14*j* the step of substrate removal has been omitted. Examples illustrated in FIGS. 14*l* and 14*m* are produced based on a variation of the method shown in FIG. 13. Here the operation of the device is reversed, i.e. the M/FIR radiation is received at the top and the NIR emission is transmitted through the bottom of the device. This necessitates bonding of the QWIP-LED wafer to a transparent substrate at the top in order to enable removal of the first substrate at the bottom, followed by etching V-grooves into the bottom layers and then bonding the bottom side of the wafer to an optical faceplate.

Numerous other embodiments of the invention will be apparent to persons skilled in the art without departing from the spirit and scope of the invention as defined in the appended claims.

What is claimed is:

1. A method comprising:

micro-fabricating a pixelless thermal imaging device for up-converting a sensed 2-dimensional M/FIR image into a 2-dimensional image in the NIR to visible spectrum, the step of micro-fabricating comprising the steps of:

providing a first substrate, the first substrate having a surface suitable for subsequent crystal growth;

crystallographically growing on the surface of the first substrate a plurality of layers forming an integrated QWIP-LED wafer;

patterning an integrated QWIP-LED wafer forming a device mesa, the device mesa approximately comprising an active area of the thermal imaging device, the active area being approximately the size of the 2-dimensional image in the NIR to visible spectrum; and, isolating material defects in the active area of the QWIP-LED using a laser in order to reduce the effect of the material defect on the operation of the QWIP-LED.

2. A method for micro-fabricating a pixelless thermal imaging device as defined in claim 1, wherein the first substrate comprises a n$^+$ substrate.

3. A method for micro-fabricating a pixelless thermal imaging device as defined in claim 1, wherein the QWIP comprises a p-type QWIP.

4. A method for micro-fabricating a pixelless thermal imaging device as defined in claim 1, wherein the QWIP-LED wafer comprises a n-type QWIP and a p-type QWIP.

5. A method for micro-fabricating a pixelless thermal imaging device as defined in claim 4, wherein the LED is interposed between the n-type QWIP and the p-type QWIP.

6. A method for micro-fabricating a pixelless thermal imaging device as defined in claim 1, bonding the top surface of the QWIP-LED wafer to a second substrate.

7. A method for micro-fabricating a pixelless thermal imaging device as defined in claim 6, wherein the second substrate comprises a fiber optical faceplate.

8. A method for micro-fabricating a pixelless thermal imaging device as defined in claim 7, wherein the second substrate comprises a CCD.

9. A method for micro-fabricating a pixelless thermal imaging device as defined in claim 8, wherein the thickness of an optical adhesive layer interposed between the QWIP-LED wafer and the CCD is less than the wavelength of the LED emission.

* * * * *